(12) United States Patent
Chao et al.

(10) Patent No.: US 9,023,679 B2
(45) Date of Patent: May 5, 2015

(54) PREPARATION METHOD FOR ORGANIC SOLAR CELLS HAVING CONDUCTIVE NANORODS

(71) Applicant: Chung Yuan Christian University, Chung Li (TW)

(72) Inventors: Yu-Chiang Chao, Taoyuan County (TW); Fu-Min Chan, New Taipei (TW)

(73) Assignee: Chung Yuan Christian University, Chung Li (TW)

( * ) Notice: Subject to any disclaimer, the term of this patent is extended or adjusted under 35 U.S.C. 154(b) by 33 days.

(21) Appl. No.: 13/928,565

(22) Filed: Jun. 27, 2013

(65) Prior Publication Data

US 2014/0357013 A1 Dec. 4, 2014

(30) Foreign Application Priority Data

May 28, 2013 (TW) .................. 102118816

(51) Int. Cl.
*H01L 21/00* (2006.01)
*H01L 51/44* (2006.01)
*H01L 51/00* (2006.01)
*H01L 51/42* (2006.01)

(52) U.S. Cl.
CPC .......... *H01L 51/442* (2013.01); *H01L 51/0021* (2013.01); *H01L 51/424* (2013.01); *H01L 51/0037* (2013.01); *H01L 51/4273* (2013.01); *H01L 2251/308* (2013.01)

(58) Field of Classification Search
CPC .............. H01L 2251/308; H01L 51/0037; H01L 51/424; H01L 51/4273
USPC .............. 438/82, 99; 136/263; 257/40
See application file for complete search history.

(56) References Cited

U.S. PATENT DOCUMENTS

| | | | |
|---|---|---|---|
| 2007/0111368 A1* | 5/2007 | Zhang et al. ................ | 438/99 |
| 2008/0041446 A1* | 2/2008 | Wu et al. ................... | 136/263 |
| 2008/0217576 A1* | 9/2008 | Stockum et al. ............ | 252/79.2 |
| 2010/0243295 A1* | 9/2010 | Allemand et al. ........... | 174/250 |
| 2010/0258160 A1* | 10/2010 | Wang et al. ................ | 136/246 |
| 2010/0307592 A1* | 12/2010 | Chang et al. ............... | 136/263 |
| 2011/0126896 A1* | 6/2011 | Wang et al. ................ | 136/256 |
| 2011/0308613 A1* | 12/2011 | Tseng et al. ............... | 136/260 |
| 2013/0048062 A1* | 2/2013 | Min et al. .................. | 136/255 |
| 2013/0248822 A1* | 9/2013 | Gong ......................... | 257/26 |
| 2013/0269766 A1* | 10/2013 | Park et al. .................. | 136/256 |
| 2013/0291944 A1* | 11/2013 | Takagi et al. ............... | 136/263 |
| 2014/0041718 A1* | 2/2014 | Guha et al. ................. | 136/255 |

* cited by examiner

*Primary Examiner* — Bac Au
(74) *Attorney, Agent, or Firm* — Rosenberg, Klein & Lee

(57) ABSTRACT

The present invention provides a preparation method for organic solar cells having conductive nanorods. In the process of solar cells, the present invention etches the indium-tin-oxide layer, which used as the anode, using etching fluid and forms the structure of the conductive nanorods thereon. Thereby, the distance of the holes in the active layer conducted to the anode is shorted. Besides, the light scattering or the transmittivity of the indium-tin-oxide layer is increased, which improves the efficiency of photoelectric conversion in organic solar cells.

6 Claims, 5 Drawing Sheets

PREPARATION METHOD FOR ORGANIC SOLAR CELLS HAVING CONDUCTIVE NANORODS

FIELD OF THE INVENTION

The present invention relates generally to a preparation method for organic solar cells having conductive nanorods, and particularly to a preparation method for organic solar cells having conductive nanorods by etching a patterned indium-tin-oxide layer using etching fluid and producing nanorod structure for facilitating collecting holes in the active layer.

BACKGROUND OF THE INVENTION

The research of solar cells is an expected direction in renewable energy sources. Although the majority of the current commercialized products adopt silicon as the main material, organic solar cells attract attention by industry and academic community due to their simple process, low cost, light material, and flexibility.

Nonetheless, there are still many drawbacks in organic solar cells, for example, low conversion efficiency, low carrier mobility, and low device lifetime.

The active layer of organic solar cells has the functions of light-energy absorption, exciton dissociation, namely, electron-hole pairs, and electron and hole conduction. Because electrons and holes tend to encounter and recombine with each other in a single material, the efficiency of the organic solar cells having a single active layer is not high; they are mainly prepared using a double-layer structure.

In double active layer organic solar cells, the electron donors absorb light energy and become excitons. When the excitons transport to the interface between the electron donors and electron acceptors, they are dissociated into electrons and holes. Then, the electrons transport to the cathode layer in the electron acceptors; the holes transport to the anode layer, which is composed by indium tin oxides, in the electron donors.

Because electron donors and electron acceptors can conduct electrons and holes individually, recombination of electrons and holes is reduced substantially. Nonetheless, since the area of the interface of exciton dissociation is limited to the contact area between electron donors and electron acceptors, even the conversion efficiency of double-layer organic solar cells is higher than that of single-layer organic solar cells, the former are still not ideal in structure.

There is an improved structure named bulk heterojunction organic solar cells. According to the structure, electron donors and electron acceptors are both dissolved and mixed in organic solution and forming the active layer. After proper processes, phase separation occurs in electron donors and electron acceptors and thus forming transport channels for holes and electrons. In addition, thanks to phase separation, the spots for dissociating excitons on the contact area between electron donors and electron acceptors increase, thus increasing the photocurrent.

Currently, the electron donors normally used are Poly(3-hexylthiophene-2,5-diyl) (P3HT); the electron acceptors normally used are [6,6]-phenyl-C61-butyric acid methylester (PCBM). As the excitons are dissociated into electrons and holes at the interface between P3HT and PCBM, electrons will be conducted to the cathode while holes will be conducted to the anode. At this time, the holes generated near the anode can be conducted to the anode faster and becoming photocurrent. The holes farer to the anode need more time to be conducted to the anode. Besides, in the conduction path, recombination with holes is more. Moreover, the hole mobility of P3HT is lower than the electron mobility of PCBM. Thereby, there is greater resistance along the channel of conducting holes to the anode.

SUMMARY

An objective of the present invention is to provide a preparation method for organic solar cells having conductive nanorods. By using the etching method, the anode can has conductive nanorod structure directly. Thereby, the time for the holes generated in the active layer to reach the anode is shortened. In addition, the transmittivity of the anode is enhanced.

Another objective of the present invention is to provide a preparation method for organic solar cells having conductive nanorods. A hole transport layer is disposed between the anode and the active layer of the organic solar cells for assisting the conduction of holes.

Still another objective of the present invention is to provide a preparation method for organic solar cells having conductive nanorods. For the disposition of the hole transport layer, by adjusting the ratio of the solution, the formed hole transport layer can have a plurality of gaps between conductive nanorods. Alternatively, a plane can be formed on the conductive nanorods.

For achieving the objectives described above, the present invention discloses a preparation method for organic solar cells having conductive nanorods, which comprises steps of disposing a patterned indium-tin-oxide layer on a substrate; etching the patterned indium-tin-oxide layer and forming a plurality of conductive nanorods; coating a hole transport layer on the plurality of conductive nanorods; disposing an active layer on the hole transport layer; and disposing a cathode layer on the active layer. According to the method, with the presence of conductive nanorods, the organic solar cells prepared provide shorter transport paths for holes and increase the transmittivity of the anode. Thereby, the power generating efficiency of organic solar cells can be enhanced.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
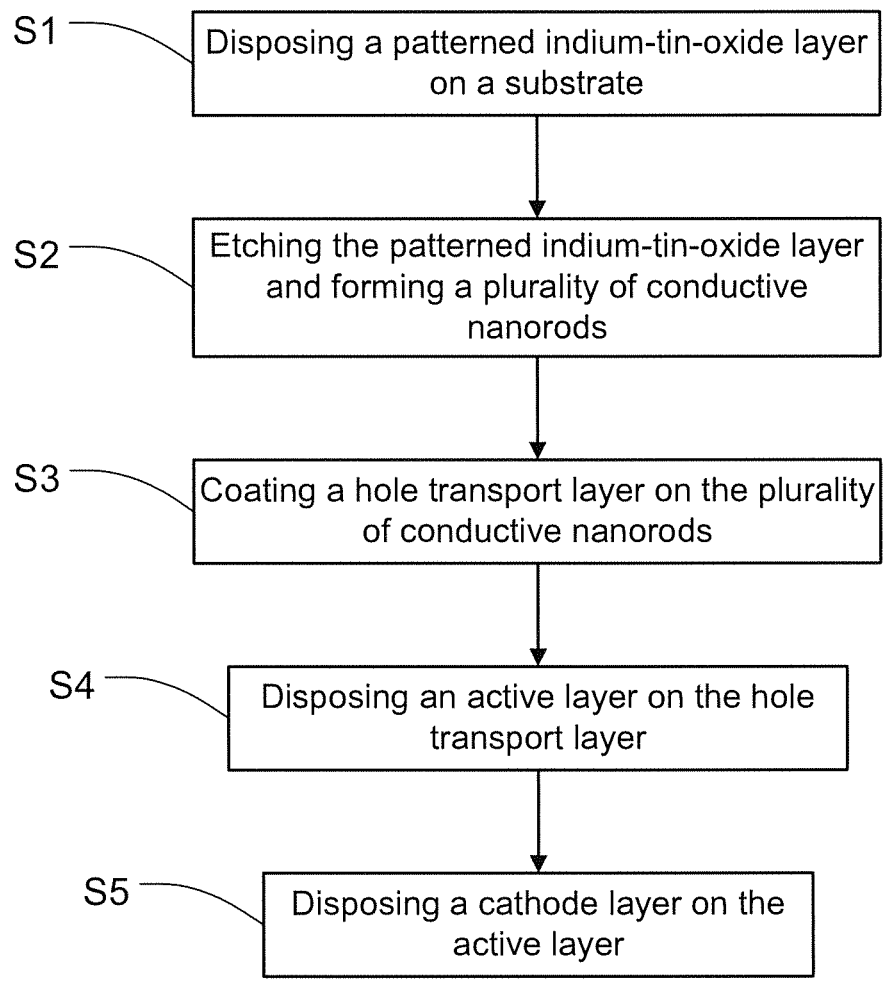
FIG. 1 shows the flowchart according to the present invention.

First, FIG. 1 shows the flowchart according to the present invention. As shown in the figure, the method comprises steps of:

Step S1: Disposing a patterned indium-tin-oxide layer on a substrate;

Step S2: Etching the patterned indium-tin-oxide layer and forming a plurality of conductive nanorods;

Step S3: Coating a hole transport layer on the plurality of conductive nanorods;

Step S4: Disposing an active layer on the hole transport layer; and

Step S5: Disposing a cathode layer on the active layer.

In the present invention, while preparing organic solar cells, the nanorod structure is formed by etching the patterned indium-tin-oxide (ITO) layer using etching fluid. Thereby, the holes in the active layer can reach the ITO layer more rapidly and the moving path of the holes is shortened. Thereby, the power generating efficiency is enhanced.

Figure 2:
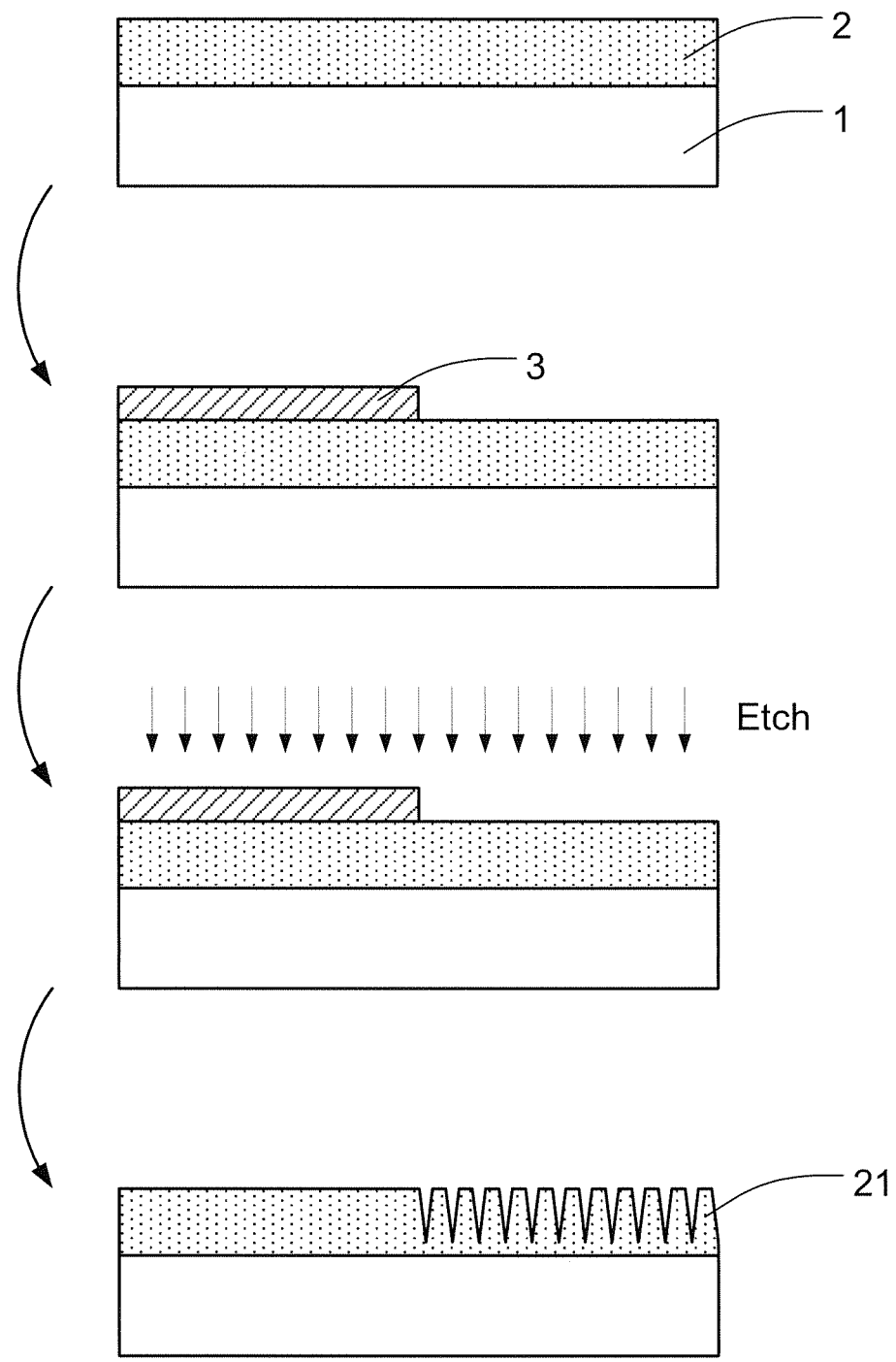
FIG. 2 shows the partial processes according to the present invention.

FIG. 2 shows the partial processes according to the present invention. As shown in the figure, at first, the patterned indium-tin-oxide layer 2 (ITO layer 2) is disposed on a substrate. This ITO layer 2 adopts indium tin oxide as the material and used as the anode of organic solar cells. The ITO layer 2 is deposited on the substrate 1 made of glass. This is the normal and general structure of organic solar cells.

On the ITO layer 2, poly(3,4-ethylenedioxythiophene) (PEDOT) is normally coated and used as the hole transport layer. Nonetheless, according to the present invention, before costing the hole transport layer, the ITO layer 2 is processed for preparing nanorods. As shown in FIG. 2, a protection layer 3 can be disposed on the ITO layer 2 first with the purpose of covering the region needing no nanorods. In practice according to the present invention, aluminum (Al) is used as the material of the protection layer 3, which can be removed during the etching process.

After the protection layer 2 covers the region of the ITO layer 2 requiring no etching, the substrate 1 is immersed into an etching fluid for etching the ITO layer 2 thereon and forming a plurality of conductive nanorods 21. According to the present embodiment of the present invention, the adopted etching fluid is phosphoric acid ($H_3PO_4$). In addition, the temperature is raised to 40° C. for improving the efficiency. Nonetheless, the etching material is not limited to phosphoric acid; other appropriate etching material can be used as well.

Figure 3:
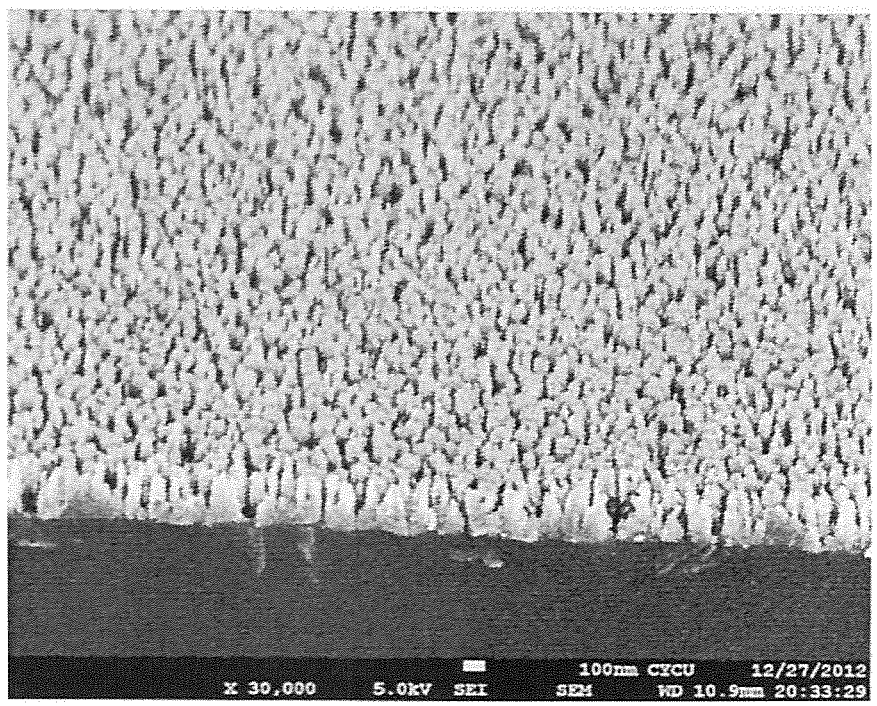
FIG. 3 shows an electron microscopic picture of the conductive nanorods formed by etching according to the present invention.

Because the protection layer 3 will be removed during the etching process, the time when the etching stops is just the moment when the protection layer 3 is completely removed. At this time, after etched by the etching fluid including phosphoric acid, the ITO layer 2 not covered by the protection layer 3 will produce the conductive nanorods 21 shown in the picture of FIG. 3 taken using a scanning electron microscope.

Figure 4A:
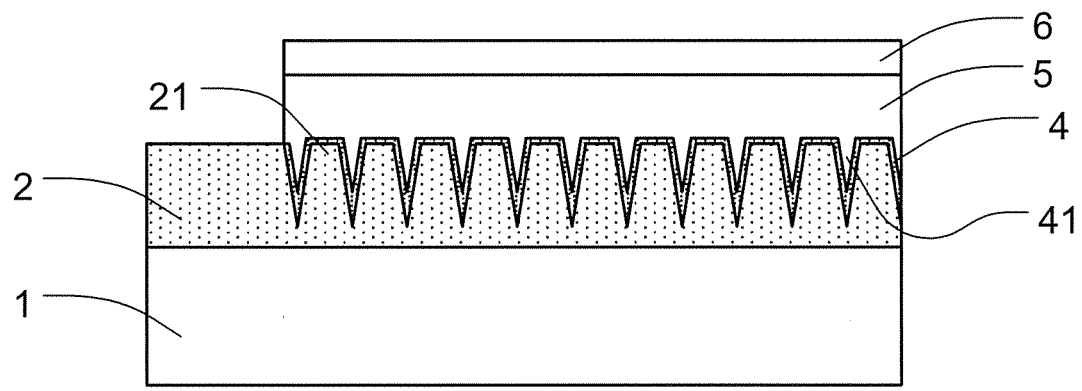
FIG. 4A show a structural schematic diagram of the hole transport layer according to a preferred embodiment of the present invention.
Figure 4B:
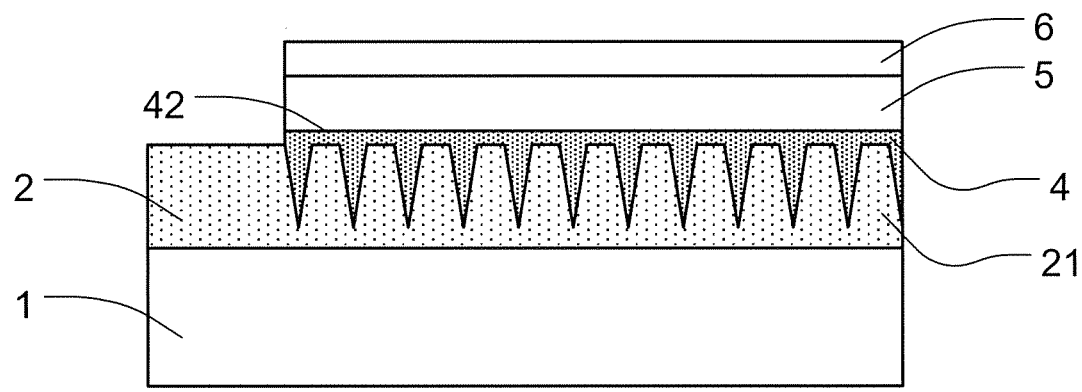
FIG. 4B show a structural schematic diagram of the hole transport layer according to another preferred embodiment of the present invention.
Figure 5A:
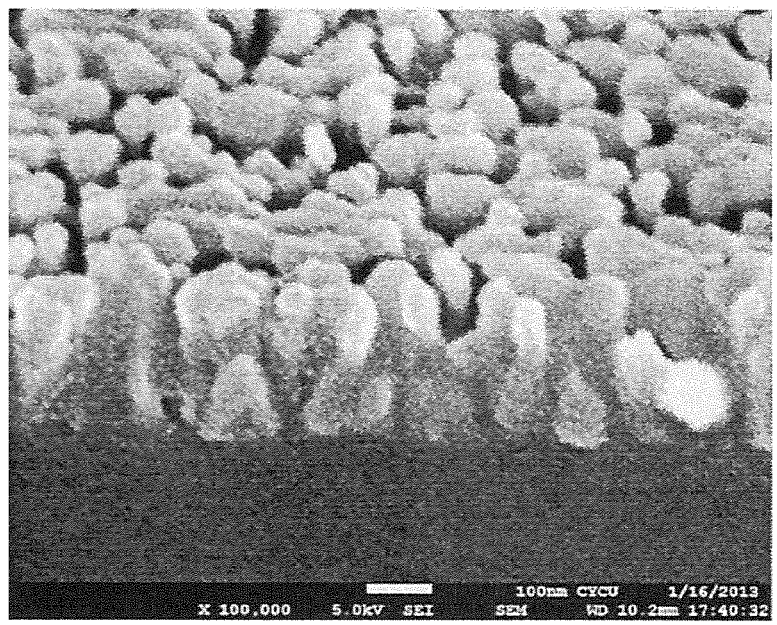
FIG. 5A shows an electron microscopic picture of the hole transport layer according to a preferred embodiment of the present invention.
Figure 5B:
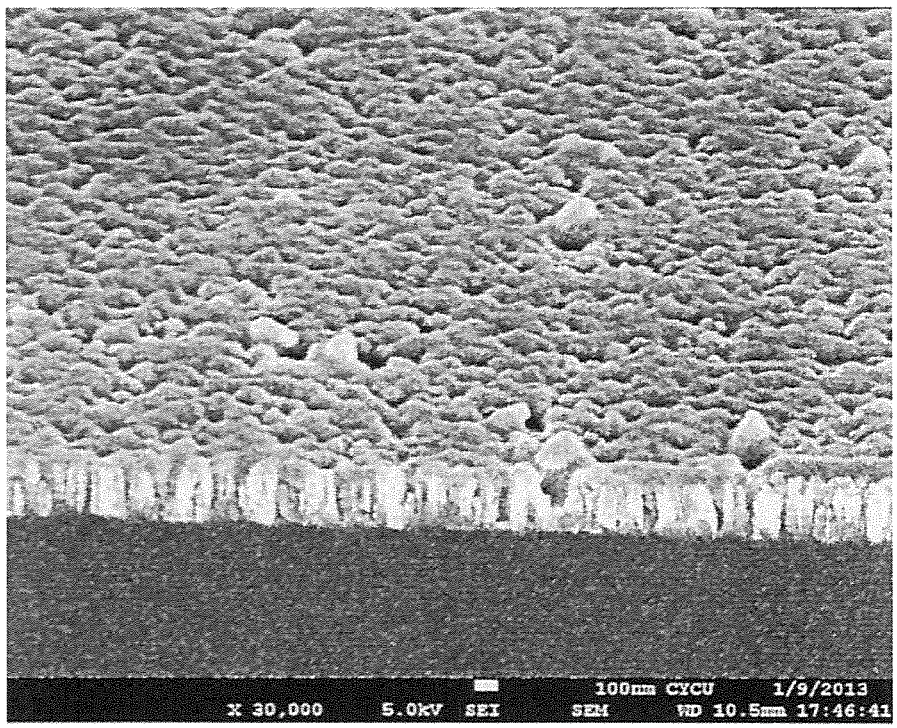
FIG. 5B shows an electron microscopic picture of the hole transport layer according to another preferred embodiment of the present invention.

Next, according to the present invention, the conductive polymer PEDOT is spun coated on the ITO layer 2 having the conductive nanorods 21 and used as the hole transport layer. This PEDOT is essentially the mixture of PEDOT and poly(styrenesulfonate) (PSS). Hence, in the following, it is referred to as PEDOT/PSS. Please refer to FIG. 4A and FIG. 4B, which disclose two structures of the hold transport layer 4 according to the present invention. In FIG. 4A, the hole transport layer 4 is coated on the surface of the conductive nanorods 21 in the form of a thin film, which follows the surface and reserves the gaps 41 between the conductive nanorods 21. On the other hand, in FIG. 4B, the gaps 41 between the conductive nanorods 21 are filled and forming a plane 42. These two embodiments are achieved by different spin rates and formation of the PEDOT/PSS solution. The electron microscopic pictures of the hole transport layers are shown in FIG. 5A and FIG. 5B, respectively.

According to the present invention, the PEDOT/PSS solution while disposing the hole transport layer 4 contains isopropanol (IPA) solvent and the interface active agent Triton. IPA is used for diluting PEDOT/PSS; controlling the ratio of Triton can determine the coverage of PEDOT/PSS. In the embodiment of FIGS. 4B and 5B, the ratio of PEDOT/PSS:IPA:Triton is 10:90:1. The acquired PEDOT/PSS will fill the gaps 41 and cover the plane 42 on the conductive nanorods 21. In the embodiment of FIGS. 4A and 5A, the ratio of PEDOT/PSS:IPA:Triton is 50:50:1. The acquired PEDOT/PSS will follow the surface of the conductive nanorods 21. At a fixed ratio of PEDOT/PSS:IPA:Triton, whether PEDOT/PSS fills the gaps or follow the surface of the conductive nanorods 21 can also be controlled by controlling the spin rate during coating.

On the hole transport layer 4, the present invention further disposes the active layer 5 and the cathode layer 6. The active layer 5 adopts P3HT:PCBM as the material, which includes electron donors P3HT and electron acceptors PCBM and is generally used in the organic solar cell field. When the sunlight illuminates the material of the active layer 5, after the electrons occupying the highest molecular orbit absorb energy, they are excited to the lowest unoccupied molecular orbit and generating bonded electron-hole pairs. As the bonded electron-hole pairs diffuse to the interface between the electron donors and electron acceptors, they conquer the bonding energy and are dissociated into free carriers. Finally, the electrons and holes are collected by the cathode layer 6 of the solar cells and the ITO layer 2, which is used as the anode. Thereby, photoenergy can be converted into electrical energy.

Accordingly, the present invention forms the structure of the conductive nanorods 21 by etching the ITO layer 2. Hence, any generated holes in the gaps 41 or near the region of the conductive nanorods 21 can reach the ITO layer 2 in short distances, which shortens the transport distance of holes and increasing the contact area between electrodes and the active layer 5. In addition, more scattering will occur for the light in the ITO layer 2. The scattered light can contact the material of the active layer 5 again and thus improving the efficiency of photoelectric conversion.

The active layer 5 can be formed by spin coating the mixed solution of P3HT and PCBM. Alternative, it also can be formed by spin coating P3HT solution first and then PCBM subsequently. The cathode layer 6 located on the active layer 5 is formed by vapor plating. The material can be selected from the group consisting of aluminum, silver, calcium/aluminum, lithium fluoride, which are the materials according to the prior and no special limitation is required.

According to the above disclosure, the preparation method according to the present invention considers the problem of lower carrier mobility for electron donors. Beside, given the limited transmittivity of ITO layer, the present invention forms directly the structure of conductive nanorods in patterned ITO layer using the etching method and requiring no costly vacuum equipment. Then holes can reach the ITO layer, which is used as the anode, rapidly; the transmittivity of the ITO layer is increased as well. Thereby, given the advantages described above, the present invention undoubtedly provides a preparation method of practical vales for organic solar cells having conductive nanorods.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A preparation method for organic solar cells having conductive nanorods, comprising steps of:
    disposing a patterned indium-tin-oxide layer on a substrate;
    disposing a protection layer on said patterned indium-tin-oxide layer;
    etching said patterned indium-tin-oxide layer, and forming a plurality of conductive nanorods, said protection layer covering the portion of said patterned indium-tin-oxide layer not to be etched;
    coating a hole transport layer on said plurality of conductive nanorods;
    disposing an active layer on said hole transport layer; and
    disposing a cathode layer on said active layer;
    wherein said step of etching said patterned indium-tin-oxide layer stops when said protection layer is removed by an etching fluid.

2. The preparation method of claim 1, wherein the material of said protection layer is aluminum.

3. The preparation method of claim 1, wherein said etching fluid is phosphoric acid.

4. The preparation method of claim 1, wherein the material of said hole transport layer is poly(3,4-ethylenedioxythiophene).

5. The preparation method of claim 1, wherein said hole transport layer covers said plurality of conductive nanorods and there are a plurality of gaps between said plurality of conductive nanorods.

6. The preparation method of claim 1, wherein said hole transport layer covers said plurality of conductive nanorods and forming a plane on said plurality of conductive nanorods.

* * * * *